US010361168B2

United States Patent
Qin et al.

(10) Patent No.: US 10,361,168 B2
(45) Date of Patent: *Jul. 23, 2019

(54) SYSTEMS AND METHODS FOR OPTIMIZING LOOPING PARAMETERS AND LOOPING TRAJECTORIES IN THE FORMATION OF WIRE LOOPS

(71) Applicant: Kulicke and Soffa Industries, Inc., Fort Washington, PA (US)

(72) Inventors: Ivy Wei Qin, Lansdale, PA (US); Ray L. Cathcart, New York, NY (US); Cuong Huynh, Radnor, PA (US); Deepak Sood, New Britain, PA (US); Paul W. Sucro, Hatfield, PA (US); Joseph O. DeAngelo, Winters, CA (US)

(73) Assignee: KULICKE AND SOFFA INDUSTRIES, INC, Fort Washington, PA (US)

( * ) Notice: Subject to any disclaimer, the term of this patent is extended or adjusted under 35 U.S.C. 154(b) by 197 days.

This patent is subject to a terminal disclaimer.

(21) Appl. No.: 15/290,413

(22) Filed: Oct. 11, 2016

(65) Prior Publication Data

US 2017/0033077 A1 Feb. 2, 2017

Related U.S. Application Data

(63) Continuation of application No. 13/321,017, filed as application No. PCT/US2010/035067 on May 17, 2010, now Pat. No. 9,496,240.

(Continued)

(51) Int. Cl.
*H01L 23/00* (2006.01)
*B23K 20/00* (2006.01)
(Continued)

(52) U.S. Cl.
CPC ............ *H01L 24/85* (2013.01); *B23K 20/004* (2013.01); *H01L 22/12* (2013.01); *H01L 24/05* (2013.01);
(Continued)

(58) Field of Classification Search
CPC .............................. G06Q 10/06; B23K 11/252
(Continued)

(56) References Cited

U.S. PATENT DOCUMENTS 5,054,194 A * 10/1991 Pollock ................. A01N 43/40
228/180.5
5,119,436 A 6/1992 Holdgrafer
(Continued)

FOREIGN PATENT DOCUMENTS

JP 08-078460 3/1996
JP 2007-258334 10/2007
(Continued)

OTHER PUBLICATIONS

Prasad, Advanced Wirebond Interconnection Technology Kluwer Academic Publishers 2004, 694 Pgs. (Year: 2004).*
(Continued)

*Primary Examiner* — Emilio J Saavedra
(74) *Attorney, Agent, or Firm* — Christopher M. Spletzer, Sr.

(57) ABSTRACT

A method of forming a wire loop in connection with a semiconductor package is provided. The method includes the steps of: (1) providing package data related to the semiconductor package to a wire bonding machine; (2) providing at least one looping control value related to a desired wire loop to the wire bonding machine, the at least one looping control value including at least a loop height value related to the desired wire loop; (3) deriving looping parameters, using an algorithm, for forming the desired wire (Continued)

loop; (4) forming a first wire loop on the wire bonding machine using the looping parameters derived in step (3); (5) measuring actual looping control values of the first wire loop formed in step (4) corresponding to the at least one looping control value; and (6) comparing the actual looping control values measured in step (5) to the at least one looping control value provided in step (2).

20 Claims, 6 Drawing Sheets

Related U.S. Application Data

(60) Provisional application No. 61/179,421, filed on May 19, 2009.

(51) Int. Cl.
*H01L 21/66* (2006.01)
*B23K 101/40* (2006.01)
*B23K 101/42* (2006.01)

(52) U.S. Cl.
CPC ............ *H01L 24/43* (2013.01); *H01L 24/48* (2013.01); *B23K 2101/40* (2018.08); *B23K 2101/42* (2018.08); *H01L 2224/45015* (2013.01); *H01L 2224/45139* (2013.01); *H01L 2224/484* (2013.01); *H01L 2224/4809* (2013.01); *H01L 2224/48095* (2013.01); *H01L 2224/48227* (2013.01); *H01L 2224/859* (2013.01); *H01L 2224/85181* (2013.01); *H01L 2224/85203* (2013.01); *H01L 2224/85205* (2013.01); *H01L 2224/85207* (2013.01); *H01L 2924/00014* (2013.01); *H01L 2924/01005* (2013.01); *H01L 2924/01006* (2013.01); *H01L 2924/01019* (2013.01); *H01L 2924/01033* (2013.01); *H01L 2924/01047* (2013.01); *H01L 2924/01057* (2013.01); *H01L 2924/01074* (2013.01); *H01L 2924/01082* (2013.01)

(58) Field of Classification Search
USPC ........................................................ 700/121
See application file for complete search history.

(56) References Cited

U.S. PATENT DOCUMENTS

| | | |
|---|---|---|
| 5,150,828 A | 9/1992 | Shimizu |
| 5,566,876 A | 10/1996 | Nishimaki et al. |
| 5,591,920 A | 1/1997 | Price et al. |
| 6,564,115 B1 * | 5/2003 | Kinnaird ................. H01L 24/05 700/121 |
| 7,735,711 B2 | 6/2010 | Farassat |
| 2003/0192019 A1 | 10/2003 | Goto et al. |

FOREIGN PATENT DOCUMENTS

| | | | |
|---|---|---|---|
| JP | 2008084897 | 4/2008 | |
| JP | 2008084897 A * | 4/2008 | ............ H01L 24/78 |

OTHER PUBLICATIONS

Levine, "Choosing capillaries for fine pitch bonding" Solid State Technology, The international Magazine for Semiconductor Manufacturing, Jul. 1999, 4 pgs. PennWell Publication (Year: 1999).*
Chylak et al., "Advanced Ultra-Low-Loop Wire Bonds" SEMICON China 2006; Article. pp. 1-5.
Leung et al., "System-in-Package (SiP) Design: Issues, Approaches and Solutions" International Conference on Electronic Materials and Packaging, 2006. pp. 1-5.
Perng et al., "Illumination system for wire bonding inspection", Applied Optics, vol. 46, No. 6, Feb. 2007; pp. 845-854.
Prasad, "Advanced Wirebond Interconnection Technology" Kluwer Academic Publishers 2004, 694 Pgs.
International Search Report dated Dec. 8, 2010, International Application No. PCT/US2010/035067.

* cited by examiner

SYSTEMS AND METHODS FOR OPTIMIZING LOOPING PARAMETERS AND LOOPING TRAJECTORIES IN THE FORMATION OF WIRE LOOPS

CROSS-REFERENCE TO RELATED APPLICATIONS

This application is a continuation of U.S. patent application Ser. No. 13/321,017, filed Nov. 17, 2011 which claims the benefit of PCT Application No. PCT/US2010/035067 filed May 17, 2010, which claims the benefit of U.S. Provisional Application No. 61/179,421, filed May 19, 2009, the contents of which are incorporated herein by reference.

FIELD OF THE INVENTION

The present invention relates to the formation of wire loops, and more particularly, to improved systems and methods of optimizing the looping parameters and/or the looping trajectory used during the formation of wire loops.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine), wire loops are formed between respective locations to be electrically interconnected.

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.), varying types of bonding energy may be used including, for example, ultrasonic energy, thermosonic energy, thermocompressive energy, amongst others.

In conventional wire bonding systems, certain looping parameters are input into the wire bonding machine by an operator (e.g., through a user interface screen or the like), whereby a trajectory of the bonding tool is defined based on these looping parameters. Exemplary looping parameters include the neck height portion after first bond, kink positions to form kinks in the wire, the top of loop position, amongst others. The trajectory is the path followed by the bonding tool when the length of wire is extended between the first bond and the second bond position.

The process of manually inputting the looping parameters into the machine invariably involves a level of guesswork. After a wire loop is formed, the wire loop may be taken offline and examined. For example, manual measurements may be taken of the wire loop to determine if the wire loop meets certain specifications. The operator can then manually alter the parameters to change the resultant wire loop. This process is inherently time consuming and prone to error.

Thus, it would be desirable to provide improved systems and methods of optimizing the trajectory of a wire loop.

SUMMARY OF THE INVENTION

According to an exemplary embodiment of the present invention, a method of forming a wire loop in connection with a semiconductor package is provided. The method includes the steps of: (1) providing package data related to the semiconductor package to a wire bonding machine; (2) providing at least one looping control value related to a desired wire loop to the wire bonding machine, the at least one looping control value including at least a loop height value related to the desired wire loop; (3) deriving looping parameters, using an algorithm, for forming the desired wire loop from the package data and the at least one looping control value; (4) forming a first wire loop on the wire bonding machine using the looping parameters derived in step (3); (5) measuring actual looping control values of the first wire loop formed in step (4) corresponding to the at least one looping control value; and (6) comparing the actual looping control values measured in step (5) to the at least one looping control value provided in step (2).

According to another exemplary embodiment of the present invention, a method of determining looping parameters for forming a wire loop in connection with a semiconductor package is provided. The method includes the steps of: (1) providing package data related to the semiconductor package to a wire bonding machine; and (2) determining initial bonding parameters for forming a wire loop from loop model data stored in memory, the initial bonding parameters being derived at least partially based upon the package data provided.

The methods of the present invention may also be embodied as an apparatus (e.g., a wire bonding system, as part of the intelligence of a wire bonding system/machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

According to certain exemplary embodiments of the present invention, methods of forming wire loops, where the wire bonding system or machine optimizes the looping parameters (and thus, the looping trajectory) used to form the wire loops, are provided. Certain information is provided to the wire bonding machine including, for example, package data and looping control values. Using this information, and an algorithm(s) of the wire bonding machine, looping parameters for forming a wire loop are derived. A wire loop is then formed using these looping parameters. The looping control values of the formed wire loop are then measured (either online or offline) in order to determine if the actual looping control values of the wire loop are within acceptable tolerances/ranges. If the actual looping control values are not within an acceptable tolerance/range, the system varies the looping parameters (e.g., automatically using a closed loop system) and then forms another wire loop using the varied looping parameters. Such an iterative process may then be continued until the actual looping control values of the formed wire loop are within acceptable tolerances/ranges. Thus, desirable looping parameters (and a desirable looping trajectory) are provided.

As used herein, the term algorithm is intended to be broadly construed to refer to any type of algorithm, program, process (or combination of multiple algorithms, programs and processes) whereby a wire bonding system (or machine) receives certain information and derives looping parameters therefrom. The algorithm may also be used to vary the looping parameters if the measured looping control values are not within an acceptable tolerance/range. For example, the algorithm may include an expert system(s), a fuzzy logic control system(s), or any of a number of methodologies of receiving the provided information (e.g., package data, looping control values, measured looping control values, etc.) and deriving the desired output (e.g., looping parameters, varied looping parameters, etc.). In performing these functions, it is understood that the algorithm may work with other portions of a wire bonding machine including machine intelligence, vision, data storage, etc.

Figure 1:
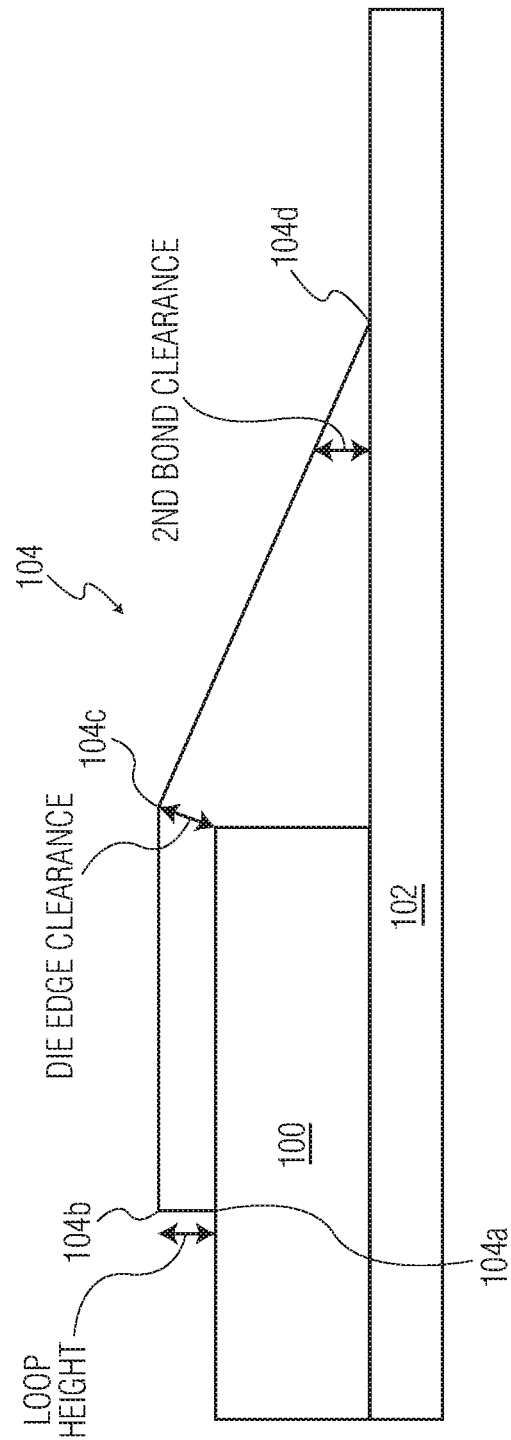
FIG. 1 is a block diagram view of a wire loop useful for explaining certain exemplary embodiments of the present invention.

FIG. 1 illustrates exemplary wire loop 104 providing electrical interconnection between a first bonding location on semiconductor die 100 and a second bonding location of substrate 102. More specifically, wire loop 104 includes: first bond 104a bonded to a first bonding location (e.g., a die pad of semiconductor die 100); and second bond 104d bonded to a second bonding location (e.g., a lead of leadframe/substrate 102). Wire loop 104 also includes a continuous length of wire between first bond 104a and second bond 104d. This length of wire has been shaped (e.g., using a wire bonding tool, not shown) to define kink/bend 104b and kink/bend 104c.

In the packaging of semiconductor devices having wire loops, it is desirable that the wire loops meet certain criteria hereinafter referred to as looping control values. Such looping control values may be selected based on a given semiconductor package design, the wire type to be used in the wire loops, and many other factors. For example, it may be desirable to establish the loop height of a wire loop as a looping control value, where the loop height is controlled to have a certain upper limit (i.e., a maximum acceptable value). It is understood that the loop height measurement may be measured with respect to a first bonding location (e.g., part of die 100 as shown in FIG. 1), a second bonding location (e.g., part of leadframe 102 as shown in FIG. 1), or another location of the semiconductor package or bonding machine. Further, loop height may refer to the highest wire loop height in a given package (e.g., in a stacked die package with wire loops positioned above one another). In connection with the present invention, a single looping control value may be selected (e.g., loop height). Alternatively, numerous looping control values may be selected for a given wire loop.

FIG. 1 illustrates three exemplary looping control values, that is: (1) loop height; (2) die edge clearance; and (3) second bond clearance. Thus, in this example, these three wire loop characteristics have been selected as "looping control values." Thus, in the optimization of the wire looping parameters (and trajectory) the algorithm will utilize the pre-defined ranges (e.g., acceptable maximum values, acceptable minimum values, acceptable ranges, etc.) for each of these looping control values. It should be noted that while FIG. 1 shows these three exemplary looping control values as having one or two dimensional values, they may have values in one, two, or three dimensions, as desired. For example, while the loop height is shown having a z-axis dimension (i.e., an up and down vertical direction), it is understood that the loop height may have x-axis and/or y-axis components (or components in other, non-Cartesian coordinate systems, if desired).

Figure 2:
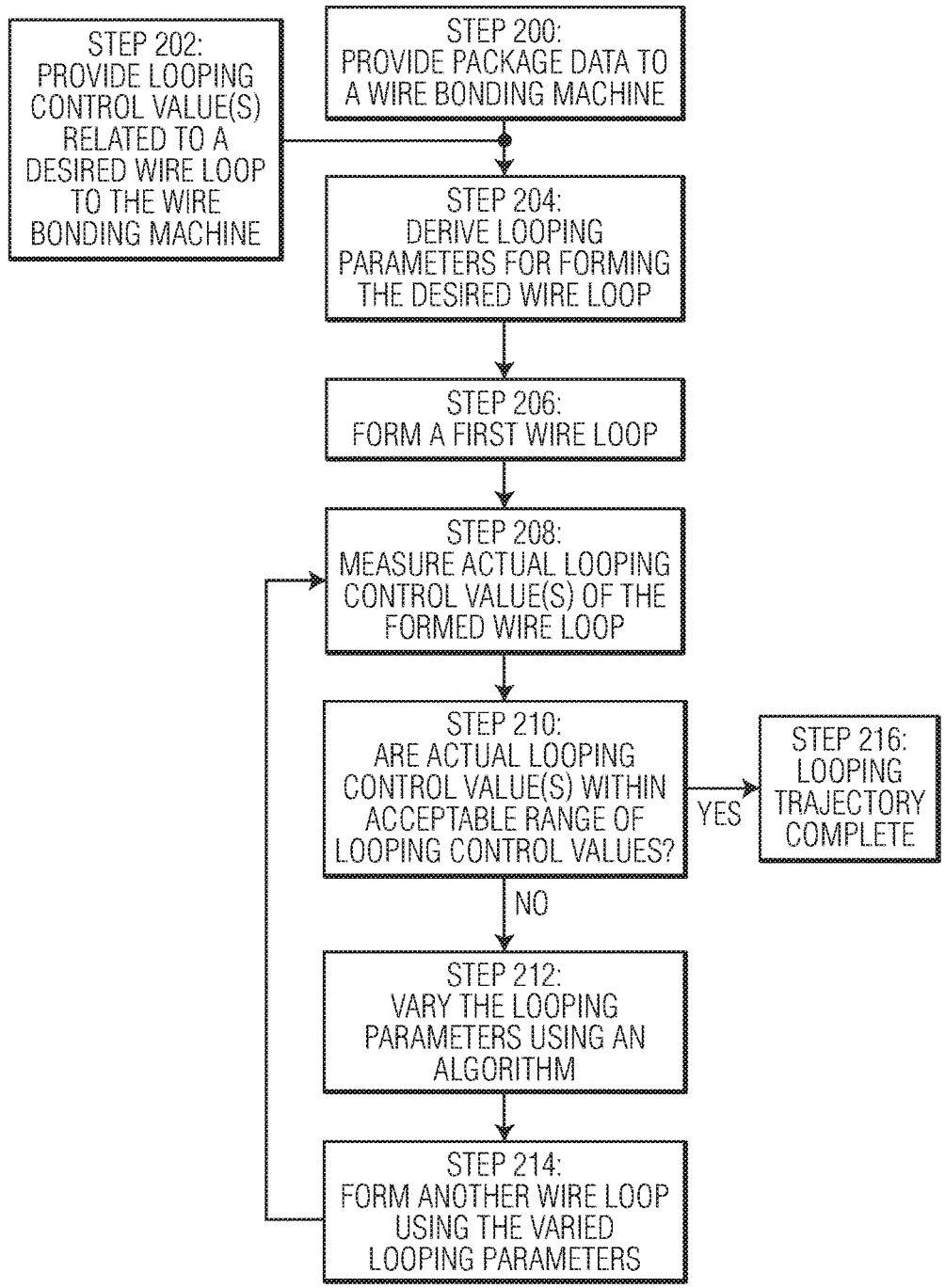
FIG. 2 is flow diagram illustrating a method of forming a wire loop, and a method of deriving a looping trajectory of the wire loop, in accordance with an exemplary embodiment of the present invention.

FIG. 2 is a flow diagram illustrating a method of forming a wire loop, and a corresponding method of optimizing the looping parameters used to form the wire loop. More specifically, the method also involves a method of deriving a looping trajectory of the wire loop by determining looping parameters that will satisfy the established looping control values (i.e., will satisfy the pre-defined acceptable tolerance/range for each looping control value selected). At Step 200, package data is provided to a wire bonding machine. Such package data is data related to the semiconductor package being formed. Such package data may be provided to the wire bonding machine using computer data about the package (e.g., CAD data related to the semiconductor package). In another example, the package data may be provided using an online (e.g., on bonder) teaching reference system of the wire bonding machine. Specific pieces of package data will, of course, vary from application to application; however, examples of the type of data that may be provided to the wire bonding machine as package data includes semiconductor die height, die pad locations of a semiconductor die, lead locations of a leadframe, relative distances between first bonding locations and second bonding locations, wire diameter, and wire type.

At Step 202, looping control value(s) are provided to the wire bonding machine (e.g., by an operator, by an algorithm, by derivation through the use of package data, etc.). For example, in a given application, it may be desirable to form a wire loop having a loop height less than a predetermined maximum loop height. Of course, looping control values other than loop height may be selected in addition to (or instead of) loop height. Exemplary looping control values (other than loop height) may include a span length of a portion of the desired wire loop, a pull strength of the desired wire loop, XYZ locations of a kink or bend in the desired wire loop, a hump characteristic of the desired wire loop, a wire sway value of the desired wire loop, a wire length in the desired wire loop, a wire length in at least a portion of the desired wire loop, a die edge clearance value of the desired wire loop, a second bond clearance value of the desired wire loop, and a shape of at least a portion of the desired wire loop. Further, loop height ranges/tolerances for multiple wire loops to be arranged above one another in a package (e.g., stacked wire loops) may also be provided as a looping control value. Of course, different or additional looping control values may be selected. As will be appreciated by those skilled in the art, the looping control value(s) provided in Step (202) may be provided as, for example, at least one of (a) an upper limit of the looping control value, (b) a lower limit of the looping control value, and (c) an acceptable range of the looping control value, etc.

At Step 204, looping parameters are derived for forming the desired wire loop. That is, using the provided package data (from Step 200) and looping control values (from Step 202), the algorithm(s) derives exemplary looping parameters. In conventional wire bonding operations, looping parameters are manually input by a user. In accordance with certain exemplary embodiments of the present invention, the looping parameters (and therefore, a looping trajectory) are defined using an algorithm(s) of the wire bonding machine. Exemplary looping parameters derived during Step 204 include: (a) a tool trajectory for forming the wire loop including the end point locations for each segment of the motion, and the trajectory between the end points; (b) bonding energy parameters to be applied by an ultrasonic transducer of the wire bonding machine; (c) bonding force parameters to be applied by the wire bonding machine; (d) timing parameters related to at least one of the bonding energy and bonding force; (e) bonding tool speed during at least a portion of a wire bonding cycle to form the desired wire loop; and (f) a wire clamp position during at least a portion of a wire bonding cycle to form the desired wire loop.

In connection with the derivation of the looping parameters at Step 204, the algorithm may utilize loop model data stored in the wire bonding machine to more closely approximate the looping parameters related to the desired wire loop. For example, through experimentation and testing, desirable looping parameters for various types of wire loops, using various wire types, may be derived and stored in the memory of the wire bonding machine (e.g., through look-up tables or the like) or accessible to the wire bonding machine (through computer networking or the like). After receiving the input data from Steps 200 and 202, the algorithm may also use this loop model data in connection with the derivation of the looping parameters. That is, without the use of the loop model data the iterative process of the present invention may take longer to determine the desirable looping parameters. By using the loop model data, the iterative process may be simplified and take less time.

At Step 206 a wire loop is formed using the derived looping parameters. At Step 208, the actual looping control value(s) of the wire loop formed in Step 206 are measured. For example, in FIG. 1, three looping control values were established for wire loop 104. That is, loop height, die edge clearance, and second bond clearance. Thus, at Step 202 desirable looping control values (acceptable ranges, tolerances, etc.) for each of loop height, die edge clearance, and second bond clearance were provided to the wire bonding machine. Now, at Step 208, the actual wire loop formed at Step 206 is measured to determine the values of these actual looping control values. At Step 210 a determination is made as to whether the actual measured looping control values are within an acceptable range, specification and/or tolerance. If the answer is "Yes" then the looping parameters are acceptable and the looping trajectory is complete at Step 216. If the answer is "No" then the looping parameters are varied (i.e., at least one of the looping parameters is varied, for example, by a predetermined increment) using an algorithm at Step 212. At Step 214 another wire loop is formed using the varied looping parameters, and then the process returns to step 208. This process is repeated until the actual measured looping control value(s) are within an acceptable range, specification and/or tolerance as defined at Step 202.

Figure 3:
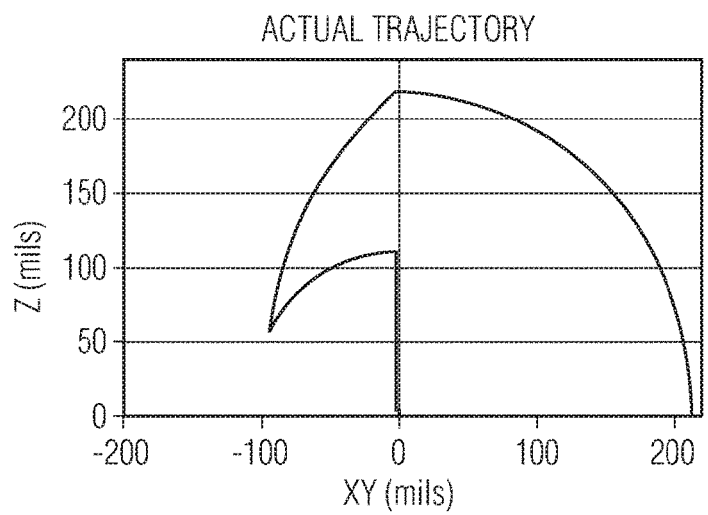
FIG. 3 is a wire looping trajectory useful in explaining certain exemplary embodiments of the present invention.

FIG. 3 illustrates an example looping trajectory for forming a wire loop. This example trajectory plots motion along the XY axes in mils (along the X axis of the graph) versus Z axis motion in mils (along the Y axis of the graph). As will be appreciated by one skilled in the art, the looping parameters derived according to the present invention correspond to a looping trajectory used to form a wire loop, such as the looping trajectory illustrated in FIG. 3.

Figure 4A:
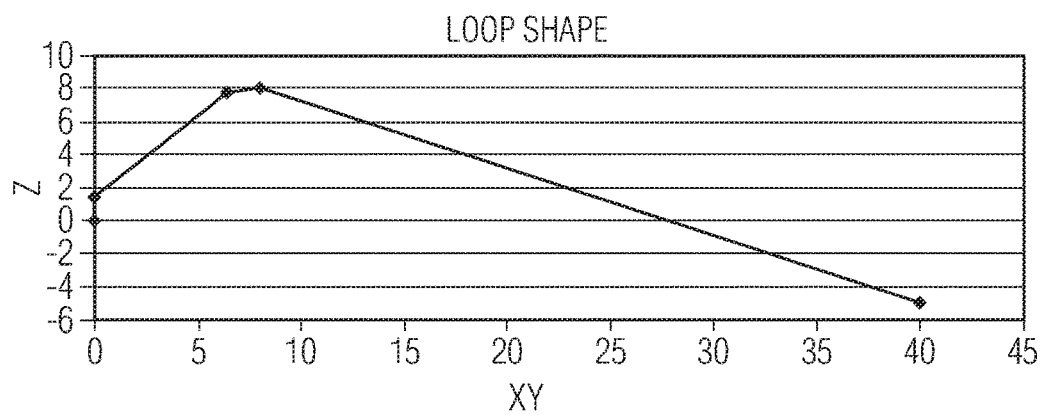
FIG. 4A is an illustration of a first iteration of a wire loop formed in accordance with an exemplary embodiment of the present invention.
Figure 4B:
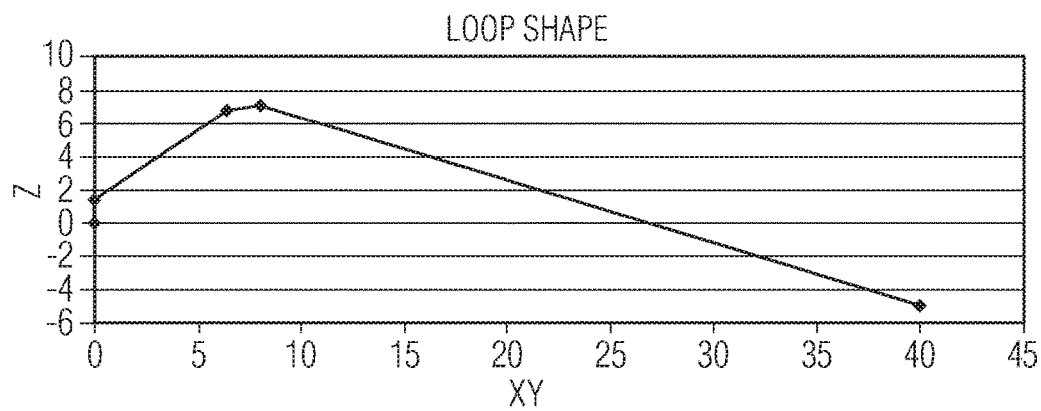
FIG. 4B is an illustration of another iteration of the wire loop shown in FIG. 4A with certain looping parameters varied in accordance with an exemplary embodiment of the present invention.

FIGS. 4A-4B illustrate an example of an iterative process according to the present invention. Let us assume that the only looping control value provided at Step 202 is loop height, and that the acceptable tolerance for the loop height looping control value is that the loop height must be no greater than 7.5 mils. At Step 206 a first wire loop is formed, and this wire loop is shown in FIG. 4A. The wire loop illustrated in FIG. 4A has a loop height of approximately 8 mils (as measured at Step 208), and therefore, at Step 210 the answer would be "No" because 8 mils exceeds the threshold for loop height of 7.5 mils. Thus, the algorithm is used to vary the looping parameters at Step 212, and a new wire loop is formed at Step 214. This new wire loop is shown in FIG. 4B with a loop height of approximately 7.1 mils. Thus, the actual measured looping control value (i.e., a loop height of 7.1 mils) meets the threshold for the looping control value (i.e., a maximum loop height of 7.5 mils) and thus the looping parameters (and trajectory) are acceptable.

Figure 5A:
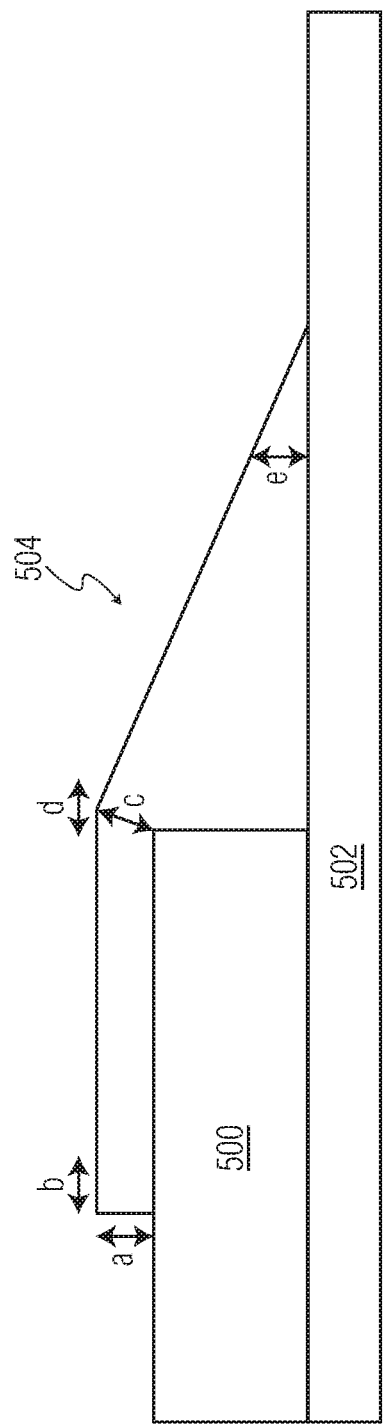
FIGS. 5A-5B are block diagrams of a wire loop useful for explaining a graphical interface provided in accordance with an exemplary embodiment of the present invention.
Figure 5B:
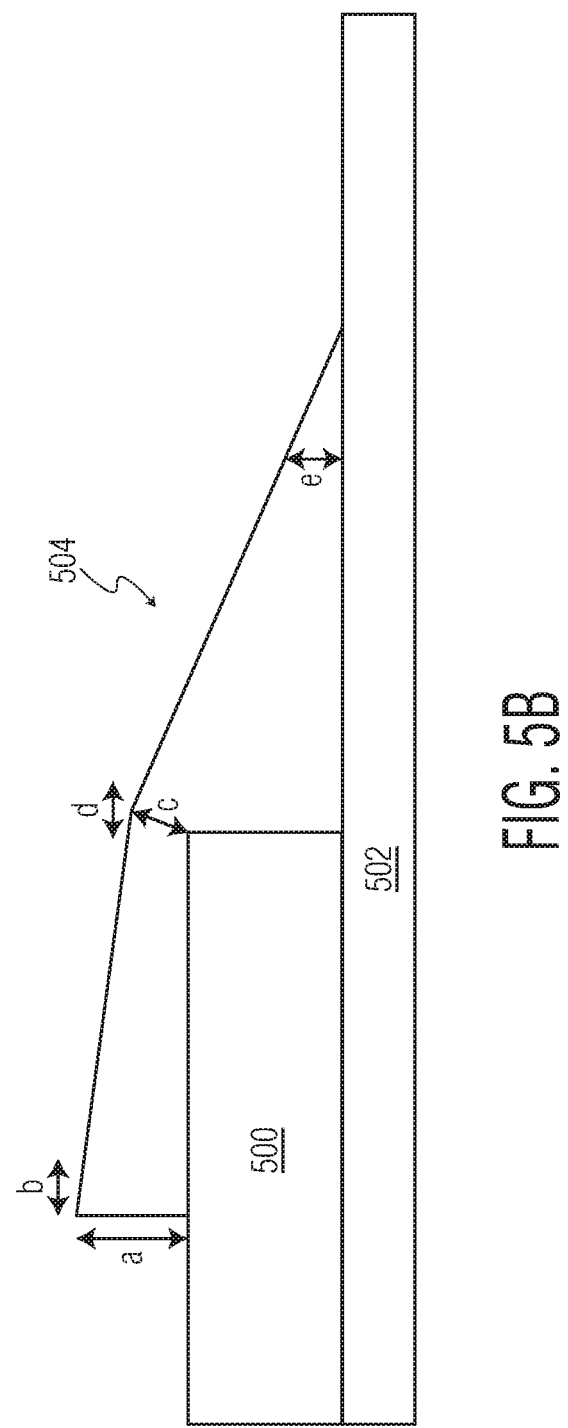

The looping control values may be input manually, for example, into a GUI (graphical user interface) or a spreadsheet/chart or the like. However, the present invention is not limited thereto. For example, at least one looping control value (e.g., the value provided in Step 202 of FIG. 2) may be provided via a graphical interface. An exemplary graphical interface may include a diagram of a model wire loop (e.g., a two-dimensional model, a three dimensional model, etc.), whereby a user can provide at least one looping control value by varying characteristics of the diagram of the model wire loop. Referring specifically to FIG. 5A, a graphical interface diagram of wire loop 504 is provided, where wire loop 504 provides electrical interconnection between die 500 and leadframe 502. This exemplary graphical interface includes 5 variables labelled "a", "b", "c", "d", and "e." Variable "a" relates to loop height, variable "b" relates to the top of loop location, variable "c" relates to the die edge clearance, variable "d" relates to the last kink location, and variable "e" relates to the second bond clearance. Of course, additional or different variables could be provided in a graphical interface for providing the looping control values. A user of the graphical interface may access one or more of these variables (e.g., by pointing and clicking a mouse or the like to the relevant portion of the graphical wire loop, by using a touch screen illustrating the graphical wire loop, etc.). Further, the interface may be provided such that the user can stretch (e.g., increase or decrease) the given variable of the graphical model wire loop to provide a looping control value as in Step 202. Referring specifically to FIG. 5B, a user has dragged variable "a" (e.g., using a mouse or the like) to extend the maximum loop height allowed for the wire loop. Thus, it can be seen that variable "a" in FIG. 5B is longer than the corresponding variable "a" in FIG. 5A, thus making clear that the maximum allowable loop height for the wire loop has been increased (i.e., by changing the loop height in the graphical interface the user has provided a new looping control value for loop height).

Of course, the present invention may be used to improve and/or optimize looping parameters (and the resultant trajectory) by controlling any of a number of looping control values. One such value may be damage done to a portion of a wire loop. More specifically, a looping parameter may be provided in connection with loop quality at a given portion of a wire loop. An example of such a looping control value would be the pull strength of a first bond of a wire loop, or the pull strength related to the neck region of a wire loop (i.e., the neck region being a portion of a wire loop after first bond where the wire loop tends to be relatively weak or damaged due to looping motions). That is, a looping control value may be provided in Step 202 of FIG. 2 which relates to a given pull strength of a first bond or of a neck region of a wire loop (e.g., a looping control value of a predetermined number of grams may be established). Then, after the wire loop is formed (or even after a first bond and looping motions are performed) the pull strength of the first bond or neck region may be determined using a pull test or the like. Such pull tests may be performed on the wire bonding machine (e.g., using a puller tool, using a close clamp pull test, amongst other techniques) or offline. For example, after performing a first bond and then performing looping motions (but before forming a second bond) a wire clamp may be closed and a pull force incrementally increased until the wire tears at the neck region of the wire loop. If the actual pull strength value of the neck region does not meet the threshold during the determination at Step 210 of FIG. 2, then the algorithm may be used to alter looping parameters at Step 212 (e.g., looping motions, bond force, ultrasonic energy, time of application of ultrasonic energy or bond force, etc.) to improve the pull strength of the neck region. That is, it is appreciated that the motions associated with formation of a wire loop after formation of a first bond (e.g., reverse motions away from the second bond location) may weaken or damage the neck region of the wire loop. By varying certain looping parameters such motions may be varied, thereby reducing the potential damage to the neck region.

As provided above, loop model data may be used in connection with the derivation of looping parameters. Such loop model data refers to data stored in memory (e.g., memory of a wire bonding machine, or memory accessible by a wire bonding machine) that includes looping parameters for wire loops. For example, after certain wire loops are successfully formed, the parameters/trajectories used to form such previously formed wire loops are stored in memory as loop model data. Later, when it is desired to form a wire loop having certain characteristics similar to the previously formed wire loop, the looping parameters used to form the previously formed wire loop may be retrieved for use as initial looping parameters.

Figure 6:
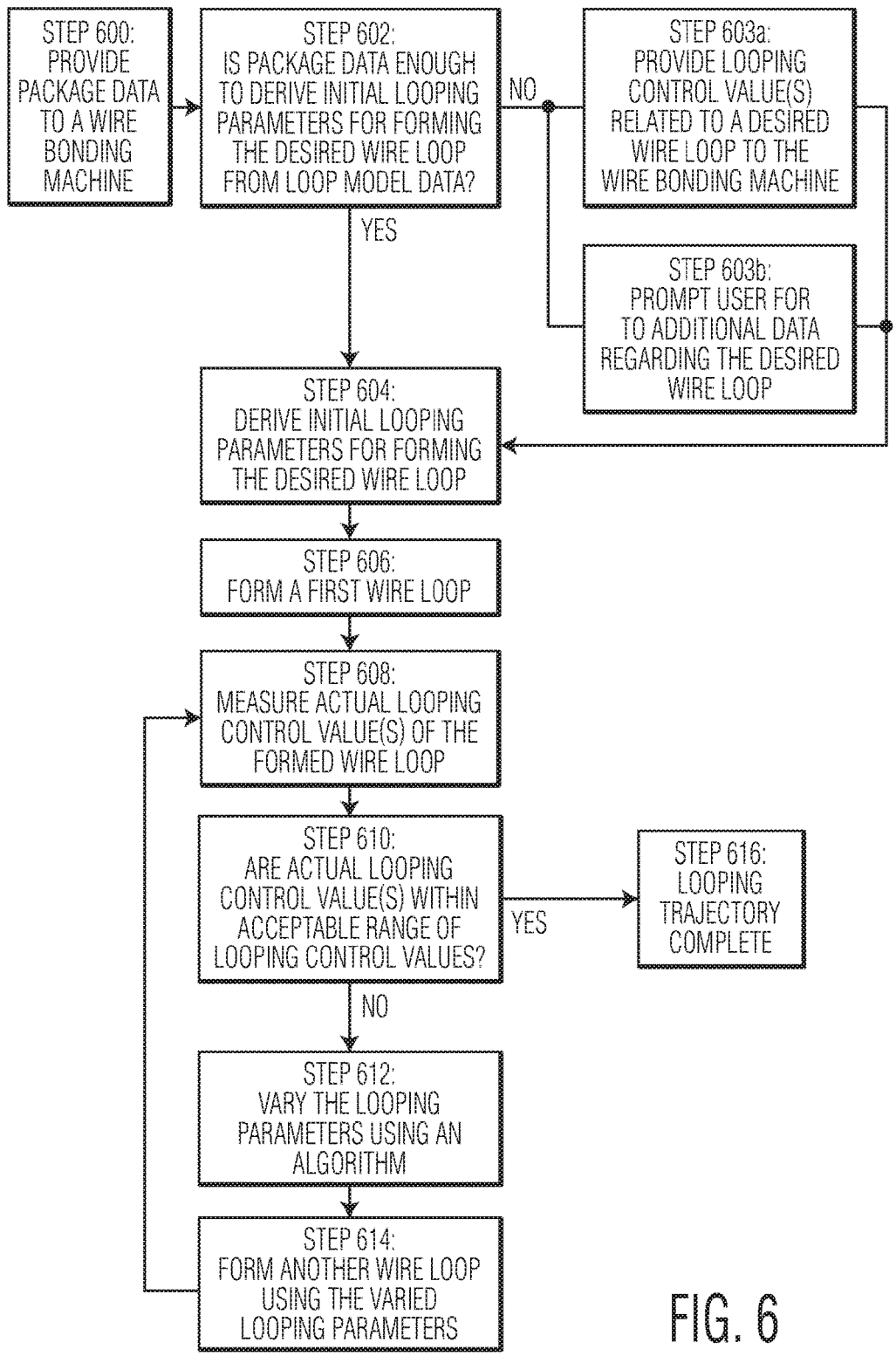
FIG. 6 is a flow diagram illustrating a method of deriving initial looping parameters for a wire loop using loop model data, and a closed loop process to optimize the looping parameters for a desired wire loop.

FIG. 6 is a flow diagram illustrating a method of deriving initial looping parameters using loop model data, and then using a closed loop process to optimize the looping parameters for a desired wire loop. At Step 600, package data (such as the package data described above with respect to FIG. 2) is provided to a wire bonding machine. Such package data may be provided using CAD data, a database (or other data structure to be populated), a graphical user interface prompting an operator to enter the package data, a teaching process, amongst other techniques. At Step 602, a determination is made (e.g., using an algorithm or the like) if initial looping parameters can be derived from the loop model data stored in memory using the package data provided at Step 600. If the answer is yes, initial looping parameters are derived at Step 604 (such as the looping parameters described above with respect to FIG. 2). That is, the package data provided at Step 600 provides information about the desired wire loop that may be compared to loop model data stored in memory. The loop model data includes information from previously formed wire loops such that the initial looping parameters for the present wire loop may be derived from looping parameters for a previously formed wire loop, where such looping parameters are stored in the loop model data.

If the answer is no at Step 602, then additional information is provided to the wire bonding system in order to derive the initial looping parameters. One example of a method of providing such additional information is that at Step 603*a*, looping control values (such as the looping control values described above with respect to FIG. 2) related to the desired wire loop are provided. Another example of a method of providing such additional information is that at Step 603*b* a user (e.g., an operator of the wire bonding machine) is prompted to enter such additional information, for example, using a GUI or the like. Such additional information may include looping control values, additional package data information, or other information to allow the algorithm to derive initial looping parameters for the desired wire loop at Step 604. After the additional information is provided to the wire bonding machine (e.g., through Step 603*a*, Step 603*b*, and/or other techniques), the initial bonding parameters are derived at Step 604 using the package data from Step 600 and the additional data provided.

At Step 606 a first wire loop is formed using the derived initial looping parameters. At Step 608, the looping control value(s) of the wire loop formed in Step 606 are measured. At Step 610 a determination is made as to whether the measured looping control values are within an acceptable range, specification and/or tolerance. If the answer is "Yes" then the looping parameters are acceptable and the looping trajectory is complete at Step 616. If the answer is "No" then the looping parameters are varied (i.e., at least one of the looping parameters is varied, for example, by a predetermined increment) using an algorithm at Step 612. At Step 614 another wire loop is formed using the varied looping parameters, and then the process returns to Step 608. This process is repeated until the measured looping control value(s) are within an acceptable range, specification and/or tolerance.

While the present invention has been described with respect to certain categories of package data, looping control values, and looping parameters, it is not limited thereto. Different or additional categories, values, and parameters are contemplated within the scope of the present invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of forming a wire loop in connection with a semiconductor package, the method comprising the steps of:
   (a) providing package date related to the semiconductor package to a wire bonding machine;
   (b) providing at least one looping control value related to a desired wire loop to the wire bonding machine, the at least one looping control value including at least one of (i) a die edge clearance of the desired wire loop, and (ii) a second bond clearance of the desired wire loop;
   (c) deriving looping parameters, using an algorithm a computer and the package data provided in step (a), for forming the desired wire loop, wherein the deriving of the looping parameters includes using loop model data stored in the wire bonding machine in connection with the algorithm to more closely approximate the looping parameters related to the desired wire loop;

(d) forming a first wire loop on the wire bonding machine using the looping parameters derived in step (c);

(e) measuring actual looping control values of the first wire loop formed in step (d) corresponding to the at least one looping control value; and (f) comparing the actual looping control values measured in step (e) to the at least one looping control value provided in step (b).

2. The method of claim 1 wherein the package data provided in step (a) includes at least one of (a1) CAD data related to the semiconductor package and (a2) package data derived using an online teaching reference system of the wire bonding machine.

3. The method of claim 1 wherein the package data provided in step (a) includes at least one of semiconductor die height, die pad locations of a semiconductor die, lead locations of a leadframe, relative distances between first bonding locations and second bonding locations, a wire diameter, and a wire type.

4. The method of claim 1 wherein the at least one looping control value provided in step (b) includes at least one of (b1) a span length of a portion of the desired wire loop, (b2) a pull strength of the desired wire loop, (b3) XYZ locations of a kink or bend in the desired wire loop, (b4) a hump characteristic of the desired wire loop, (b5) a wire sway value of the desired wire loop, (b6) a wire length in the desired wire loop, (b7) a wire length in at least a portion of the desired wire loop, (b8) a shape of at least a portion of the desired wire loop, and (b9) loop height ranges for multiple wire loops to be arranged above one another in the semiconductor package.

5. The method of claim 1 wherein the at least one looping control value provided in step (b) includes at least one of (b1) a lower limit for a pull strength value of the desired wire loop, and (b2) an acceptable range for a pull strength value of the desired wire loop.

6. The method of claim 1 wherein the at least one looping control value provided in step (b) includes at least one of (b1) a lower limit for a wire sway value of the desired wire loop, and (b2) an acceptable range for a wire sway value of the desired wire loop.

7. The method of claim 1 wherein each of the at least one looping control value provided in step (b) is provided as at least one of (b1) an upper limit of the looping control value, (b2) a lower limit of the looping control value, and (b3) an acceptable range of the looping control value.

8. The method of claim 1 wherein the at least one looping control value provided in step (b) is provided via a graphical interface.

9. The method of claim 8 wherein the graphical interface includes a diagram of a model wire loop, whereby a user provides the at least one looping control value by varying characteristics of the diagram of the model wire loop.

10. The method of claim 1 wherein the looping parameters derived in step (c) include at least one of (c1) a tool trajectory for forming the wire loop, (c2) bonding energy parameters to be applied by a transducer of the wire bonding machine, (c3) bonding force parameters to be applied by the wire bonding machine, (c4) timing parameters related to at least one of bonding energy and bonding force, (c5) bonding tool speed during at least a portion of a wire bonding cycle to form the desired wire loop, and (c6) a wire clamp position during at least a portion of a wire bonding cycle to form the desired wire loop.

11. The method of claim 1 wherein the deriving of the looping parameters in step (c) includes deriving a trajectory to be followed by a bonding tool in the formation of the desired wire loop.

12. The method of claim 1 wherein the deriving of the looping parameters in step (c) includes using loop model date stored in the wire bonding machine in connection with the algorithm to more closely approximate the looping parameters related to the desired wire loop.

13. The method of claim 12 wherein the loop model data includes data stored in a look-up table of the wire bonding machine.

14. The method of claim 1 wherein the deriving of the looping parameters in step (c) includes selecting a wire loop type to form the desired wire loop.

15. The method of claim 1 wherein step (f) includes comparing the actual looping control values measured in step (f) to the at least one looping control value provided in step (b) to determine if the actual looping control values are within an accepted tolerance level corresponding to the at least one looping control value provided in step (b).

16. The method of claim 15 further comprising the steps of: (g) varying the looping parameters using an algorithm; and (h) forming another wire loop using the varied looping parameters.

17. The method of claim 16 wherein steps (e)-(h) are repeated for successive wire loops until the actual looping control values measured in step (e) are within an accepted tolerance level corresponding to the at least one looping control value provided in step (b).

18. A method of determining looping parameters for forming a wire loop in connection with a semiconductor package, the method comprising the steps of:

(a) providing package data related to the semiconductor package to a wire bonding machine; and (b) determining initial looping parameters using an algorithm on a computer for forming a wire loop from loop model data stored in memory;

(c) providing at least one loop control value related to a desired wire loop to the wire bonding machine before step (b), the initial looping parameters being derived at least partially based upon (i) the package data provided in step (a), (ii) loop model data stored in the wire bonding machine in connection with the algorithm, and (iii) the at least one looping control value provided in step (c), wherein the at least one looping control value includes at least one of a die edge clearance of the desired wire loop and a second bond clearance of the desired wire loop; and (d) measuring actual looping control values of a first wire loop formed after step (c) corresponding to the at least one looping control value, the step of measuring being performed online on the wire bonding machine.

19. The method of claim 18 wherein the at least one looping control value includes a loop height value related to the desired wire loop.

20. The method of claim 18 further comprising the step of prompting an operator of a wire bonding machine for additional data regarding a desired wire loop before step (b), and wherein the initial looping parameters are derived at step (b) at least partially based upon the additional data provided by the operator.

* * * * *